(12) United States Patent
Waffenschmidt

(10) Patent No.: US 6,304,074 B1
(45) Date of Patent: Oct. 16, 2001

(54) METHOD FOR THE OFFSET CALIBRATION OF A MAGNETORESISTIVE ANGLE SENSOR INCLUDING AT LEAST ONE WHEATSTONE BRIDGE

(75) Inventor: Eberhard Waffenschmidt, Aachen (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/437,478

(22) Filed: Nov. 10, 1999

(30) Foreign Application Priority Data

Nov. 13, 1998 (DE) .............................. 198 52 502

(51) Int. Cl.⁷ .............. G01B 7/30; G01R 35/00
(52) U.S. Cl. .............. 324/202; 324/207.21; 324/207.12; 324/207.25
(58) Field of Search .............. 324/202, 207.12, 324/207.2, 207.21, 207.25, 252

(56) References Cited

U.S. PATENT DOCUMENTS 5,021,736 * 6/1991 Gonsalves et al. .................. 324/202
6,104,787 * 8/2000 Marx et al. ..................... 324/207.21

* cited by examiner

Primary Examiner—Jay Patidar
(74) Attorney, Agent, or Firm—Aaron Waxler

(57) ABSTRACT

For the offset calibration of a magnetoresistive angle sensor for the determination of the directions of magnetic fields, the sensor includes a Wheatstone bridge with at least four magnetoresistive resistors. The Wheatstone bridge receives an input signal at its input side, in particular an input voltage, and supplies an angle signal at its output side, in particular an angle voltage, in dependence on the direction of a magnetic field which acts on the Wheatstone bridge. The Wheatstone bridge includes a first and a second pair of mutually opposed, substantially parallel magnetoresistive resistors, the first and the second pair being arranged substantially at right angles to one another, while the direction of the magnetic field can be determined from the angle signal supplied by the Wheatstone bridge by means of an evaluation circuit. In a first step the Wheatstone bridge is acted upon by a direct magnetic field which is so aligned that it is neither substantially perpendicular to the magnetoresistive resistors of the first pair nor substantially perpendicular to the magnetoresistive resistors of the second pair of the Wheatstone bridge. In a second step the direct magnetic field is removed, and in a third step an evaluation circuit determines an offset calibration signal, the angle signal supplied by the Wheatstone bridge without direct magnetic field being a measure for the offset of the Wheatstone bridge.

9 Claims, 3 Drawing Sheets

METHOD FOR THE OFFSET CALIBRATION OF A MAGNETORESISTIVE ANGLE SENSOR INCLUDING AT LEAST ONE WHEATSTONE BRIDGE

BACKGROUND OF THE INVENTION

The invention relates to a method for the offset calibration of a magnetoresistive angle sensor for the determination of the directions of magnetic fields, which sensor comprises at least a Wheatstone bridge with at least four magnetoresistive resistors, which Wheatstone bridge is capable of receiving an input signal at its input side, in particular an input voltage, and which Wheatstone bridge is designed for supplying an angle signal at its output side, in particular an angle voltage, in dependence on the direction of a magnetic field which acts on the Wheatstone bridge, said Wheatstone bridge comprising a first and a second pair of mutually opposed, substantially parallel magnetoresistive resistors, the first and the second pair being arranged substantially at right angles to one another, while the direction of the magnetic field can be determined from the angle signal supplied by the Wheatstone bridge (by means of an evaluation circuit), and the invention also relates to a sensor device for measuring the angle of a magnetic field, comprising a magnetoresistive angle sensor which comprises at least a Wheatstone bridge with at least four magnetoresistive resistors, which Wheatstone bridge is capable of receiving an input signal at its input, in particular an input voltage, and which Wheatstone bridge is designed for supplying an angle signal at its output side in dependence on the direction of a magnetic field which acts on the Wheatstone bridge, said Wheatstone bridge comprising a first and a second pair of mutually opposed, substantially parallel magnetoresistive resistors, the first and the second pair being substantially orthogonal to one another, while the direction of the magnetic field can be determined from the angle signal supplied by the Wheatstone bridge by means of an evaluation circuit.

Such a method and such a sensor device are known, for example, from data book SC 17 "Semiconductor Sensors" of the Philips company. This known sensor device comprises a magnetoresistive angle sensor KMZ41 which consists of two Wheatstone bridges with four magnetoresistive resistors each. The two Wheatstone bridges are arranged so as to enclose an angle of 45° with one another. An input voltage is applied to the input of each of the Wheatstone bridges. The output voltage of the first Wheatstone bridge is dependent on the angle of the magnetic field acting on the first Wheatstone bridge in a cosine function. The output voltage of the second Wheatstone bridge is dependent on the angle of the magnetic field acting on the second Wheatstone bridge in a sine function. The known sensor device is combined with an evaluation circuit which calculates the angle of the magnetic field from the output voltages of the first and the second Wheatstone bridges by means of the so-called Cordic algorithm. Irreproducibilities in the manufacturing process will in general render the magnetoresistive resistors of any Wheatstone bridge unequal, so that an unknown offset voltage will be added to each output voltage. An offset calibration is accordingly necessary so as to render possible an error-free angle measurement. The calibration in the known method takes place by means of a magnet which rotates in a very exact manner in front of the sensor. The offset voltages are determined iteratively through a comparison of the sensor output signal with a pulse width modulated signal. Such a calibration method is time-consuming owing to the iterative process, requires an expensive equipment on account of the rotating magnet during the calibration process, and requires additional inputs for the evaluation circuit, which are used for trimming only.

SUMMARY OF THE INVENTION

It is an object of the invention to provide a calibration method which can be carried out more simply and which requires a less expensive evaluation circuit.

According to the invention, this object is achieved by means of a method which is characterized in that in a first step the Wheatstone bridge is acted upon by a direct magnetic field which is so aligned that it is neither substantially perpendicular to the magnetoresistive resistors of the first pair nor substantially perpendicular to the magnetoresistive resistors of the second pair of the Wheatstone bridge, in that in a second step the direct magnetic field is removed, and in that in a third step an evaluation circuit is provided for determining an offset calibration signal, the angle signal supplied by the Wheatstone bridge without direct magnetic field being a measure for the offset of the Wheatstone bridge.

In the first step, a direct magnetic field is applied to the Wheatstone bridge. The output voltage of the Wheatstone bridge depends on the angle at which the direct magnetic field acts on the Wheatstone bridge. The resistance values of the individual magnetoresistive resistors of the Wheatstone bridge are at their lowest when the direct magnetic field is directed perpendicularly to the magnetoresistive resistors, i.e. perpendicularly to the longitudinal axis and perpendicularly to the current flow direction of the magnetoresistive resistors. If the direct magnetic field is perpendicular to the magnetoresistive resistors of the first pair or perpendicular to the magnetoresistive resistors of the second pair of the Wheatstone bridge, the total value of the output voltage of the Wheatstone bridge will be at a maximum. According to the invention, the direct magnetic field acting on the Wheatstone bridge in the first step should be so directed that it is neither substantially perpendicular to the magnetoresistive resistors of the first pair nor substantially perpendicular to the magnetoresistive resistors of the second pair of the Wheatstone bridge. This means that the maximum ranges of the output voltage of the Wheatstone bridge should be avoided. Now if the direct magnetic field acting on the Wheatstone bridge is removed in the second step, the output voltages of the Wheatstone bridge depend on the angle at which the direct magnetic field has acted on the Wheatstone bridge. The invention is based on the recognition that the output voltage in the second step, i.e. after the removal of the direct magnetic field, deviates only very little from the offset voltage of the Wheatstone bridge over comparatively wide angle ranges of the angle of the direct magnetic field which was active during the first step. This renders it possible to determine the offset voltage of the Wheatstone bridge from the output voltage with the direct magnetic field being removed. Larger deviations in the measured output voltage from the offset voltage are measured upon the removal of the direct magnetic field only if the direct magnetic field acting on the Wheatstone bridge in the first step is directed perpendicularly to the magnetoresistive resistors of the first pair or perpendicularly to the magnetoresistive resistors of the second pair.

The output voltage supplied by the Wheatstone bridge after the removal of the direct magnetic field thus is a measure for the offset voltage of the Wheatstone bridge. This output signal supplied by the Wheatstone bridge without direct magnetic field is accordingly used in the third step by the evaluation circuit for offset calibration.

This method for the offset calibration does not require any expensive measuring devices and can accordingly be realized in a simple and inexpensive manner. The requirements imposed on the angular accuracy of the direct magnetic field acting on the Wheatstone bridge are very low, so that an expensive and accurate mounting of a magnet is not necessary. Deviations or drift of the angle of the direct magnetic field in the order of ±10° are definitely acceptable and have hardly any influence on the accuracy of the offset calibration. It is advantageous when the direct magnetic field acting on the Wheatstone bridge is directed at an angle of approximately 45° to the magnetoresistive resistors of the first pair and the second pair of the Wheatstone bridge. The offset calibration is particularly accurate in the case of such an angle, i.e. the output voltage supplied by the Wheatstone bridge after the removal of the direct magnetic field corresponds particularly well to the offset voltage of the Wheatstone bridge. This may be explained by the fact that the value of the angle between the current directions of the individual magnetoresistive resistors and the direct magnetic field is the same for all magnetoresistive resistors with such an alignment of the direct magnetic field. In the case of an ideal Wheatstone bridge, accordingly, the values of the magnetoresistive resistors should also all be the same, and the bridge should be perfectly tuned, i.e. the output voltage of the Wheatstone bridge should be zero.

The magnetoresistive angle sensor preferably comprises two Wheatstone bridges which are arranged at an angle of 45° relative to one another. The angular range of magnetic fields which can be unequivocally measured can be widened to 180° with such a magnetoresistive angle sensor. In addition, the measured angles are not dependent on the absolute amplitude of the angle signals in such a sensor. The result of this is that the measured angle is independent of temperature fluctuations to a high degree. An additional temperature compensation is accordingly not necessary. According to claim 3, the first and the second Wheatstone bridge are calibrated one after the other. The method described in claim 1 is accordingly carried out twice, once for the first Wheatstone bridge and subsequently for the second Wheatstone bridge.

In an advantageous embodiment of the invention, the offset calibration is carried out in an analog manner, i.e. an analog offset compensation voltage is added to the analog output voltage of the Wheatstone bridge. The analog output voltage of the Wheatstone bridge compensated by means of the analog offset compensation voltage may then be evaluated by the evaluation circuit, and the angle can be computed therefrom.

Alternatively, it is possible to provide a digital offset compensation. In the digital offset compensation, the offset voltage available at the output of the Wheatstone bridge in the third process step is preferably deposited in digital form in a nonvolatile memory. This renders possible a digital offset compensation by means of the evaluation circuit in the subsequent measuring stage.

According to an advantageous possibility for the analog offset compensation. A first voltage divider circuit is provided for the offset compensation of the first Wheatstone bridge, and a second voltage divider circuit is provided for the offset compensation of the second Wheatstone bridge. Offset compensation voltages can be added to or subtracted from the output voltages of the first and the second Wheatstone bridges, for example by means of a differential amplifier, through changes in the resistance values of the voltage dividers. An analog measurement of the offset compensation voltage in the third step is very expensive in the analog offset compensation because the output voltages of the Wheatstone bridges have to be exactly measured down to the microvolt level. An accurate measuring device would accordingly be necessary for the direct measurement. In addition, the external measuring lines could easily introduce interferences which could falsify the test result. It is accordingly advantageous to utilize the angle indication of the evaluation circuit present for determining the optimum offset compensation voltages. In the present case, the angle indication is not bound to the direction of an acting magnetic field, but it results from the instantaneous output voltages of the Wheatstone bridges, which correspond to the offset voltages. It is now possible by means of a suitable variation in the offset compensation voltages with a simultaneous measurement of the angle indication to determine the optimum compensation voltages. This will be described in more detail below.

In accordance with an advantageous method for determining the optimum offset compensation voltage of the first Wheatstone bridge, a programmable DC voltage is first added to the angle voltage of the second Wheatstone bridge. A presetting of the angle measured by means of the evaluation circuit is carried out for this purpose. It is achieved thereby that a linear dependence of the angle determined by the evaluation circuit on the A trimming voltage added to the output voltage of the first Wheatstone bridge by the first voltage divider circuit obtains in a range of approximately ±10° around the preset angle. The trimming voltages represent auxiliary voltages for determining the optimum offset compensation voltages. A first and a second trimming voltage are added to the angle voltage of the first Wheatstone bridge through a variation in the resistance values of the first voltage divider circuit, and the corresponding angle is determined by means of the evaluation circuit each time. An offset compensation voltage required for an optimum offset compensation can be calculated therefrom through interpolation. The optimum offset compensation voltage thus determined is then set by means of the first voltage divider circuit. The variation of the resistance values of the first and the second voltage divider circuit may take place, for example, by means of laser trimming and/or by the connection of known resistors to voltage dividers which are already present. The optimum offset compensation voltage for the second Wheatstone bridge can be determined in an analog manner.

As for the sensor device, the object of the invention is achieved in that the evaluation circuit has a calibration mode for determining an offset calibration signal, in that before the start of the calibration mode the Wheatstone bridge is acted upon by an (external) direct magnetic field which is so directed that it is neither substantially parallel to the magnetoresistive resistors of the first pair nor substantially parallel to the magnetoresistive resistors of the second pair of the Wheatstone bridge, whereupon said (external) direct magnetic field is removed, and in that the angle signal supplied by the Wheatstone bridge to the evaluation circuit without direct magnetic field is a measure for the offset of the Wheatstone bridge.

BRIEF DESCRIPTION OF THE DRAWINGS

The invention will now be explained in more detail with reference to a few embodiments and the accompanying drawing comprising FIGS. 1 to 7, in which.

DETAILED DESCRIPTION OF THE PREFERRED EMBODIMENTS

Figure 1:
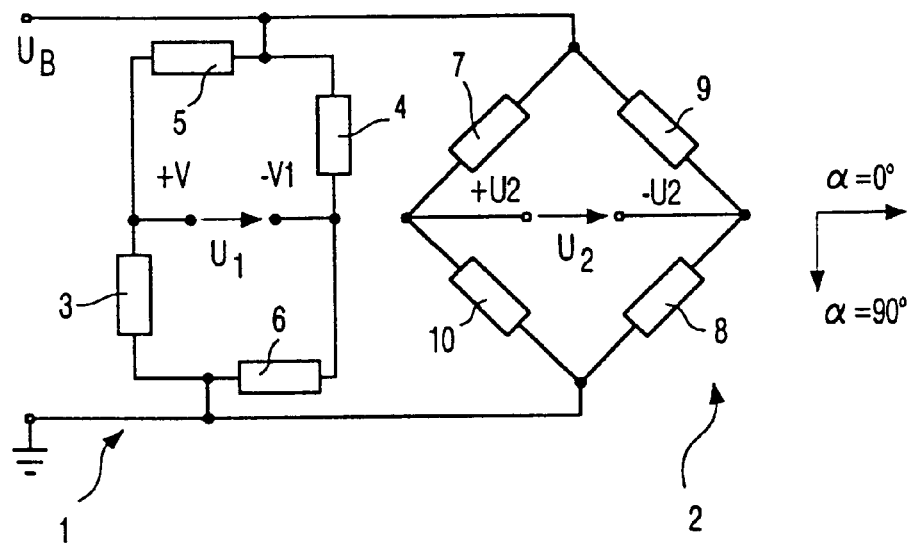
FIG. 1 is a circuit diagram of an angle sensor with two Wheatstone bridges which each comprise four magnetoresistive resistors and which are arranged at 45° relative to one another, FIG. 2 plots the angle voltages of the first and the second Wheatstone bridge of an angle sensor of FIG. 1 in dependence on the direction of the magnetic field acting on the angle sensor, which angle signals are influenced by an offset voltage.

FIG. 1 shows a magnetoresistive angle sensor which comprises a first Wheatstone bridge 1 and a second Wheatstone bridge 2. The first Wheatstone bridge 1 comprises a first magnetoresistive resistor 3 and opposite the latter a second magnetoresistive resistor 4, these two forming a first resistor pair. A third magnetoresistive resistor 5 and a fourth magnetoresistive resistor 6, which form a second pair of magnetoresistive resistors,are arranged at right angles to said first resistor pair. The first magnetoresistive resistor 3 is coupled at one side to the third magnetoresistive resistor 5 and at the other side to the fourth magnetoresistive resistor 6. The second magnetoresistive resistor 4 is coupled at one side to the third magnetoresistive resistor 5 and at the other side to the fourth magnetoresistive resistor 6. The third magnetoresistive resistor 5 is coupled at one side to the first magnetoresistive resistor 3 and at the other side to the second magnetoresistive resistor 4. The fourth magnetoresistive resistor 6 is coupled at one side to the first magnetoresistive resistor 3 and at the other side to the second magnetoresistive resistor 4. A positive operating voltage $U_B$ is supplied to the first Wheatstone bridge 1 between the second magnetoresistive resistor 4 and the third magnetoresistive resistor 5. The Wheatstone bridge is connected to a ground potential between the first magnetoresistive resistor 3 and the fourth magnetoresistive resistor 6. A positive potential terminal $+V_1$ is present between the third magnetoresistive resistor 5 and the first magnetoresistive resistor 3, and a negative potential terminal $-V_1$ is present between the second magnetoresistive resistor 4 and the fourth magnetoresistive resistor 6. A first angle voltage $U_1$ can be taken off between the positive potential terminal $+V_1$ and the negative potential terminal $-V_1$.

The second Wheatstone bridge 2 is of a similar construction as the first Wheatstone bridge 1, but it is arranged rotated through 45°. It has a fifth magnetoresistive resistor 7 and opposite thereto in parallel alignment a sixth magnetoresistive resistor 8. Perpendicularly thereto, a seventh magnetoresistive resistor 9 and an eighth magnetoresistive resistor 10 are arranged in mutual opposition. The fifth magnetoresistive resistor 7 is coupled at one side to the seventh magnetoresistive resistor 9 and at the other side to the eighth magnetoresistive resistor 10. The sixth magnetoresistive resistor 8 is coupled at one side to the seventh magnetoresistive resistor 9 and at the other side to the eighth magnetoresistive resistor 10. The second Wheatstone bridge 2 is coupled to the positive operating voltage $U_B$, between the fifth magnetoresistive resistor 7 and the seventh magnetoresistive resistor 9. The second Wheatstone bridge is coupled to ground potential between the sixth magnetoresistive resistor 8 and the eighth magnetoresistive resistor 10. The fifth magnetoresistive resistor 7 and the eighth magnetoresistive resistor 8 form a first pair. The seventh magnetoresistive resistor 9 and the eighth magnetoresistive resistor 10 form a second pair. Between the fifth magnetoresistive resistor 7 and the eighth magnetoresistive resistor 10 there is a positive potential terminal $+V_2$. A negative potential terminal $-V_2$ is provided between the seventh magnetoresistive resistor 9 and the sixth magnetoresistive resistor 8. A second angle voltage $U_2$ can be taken off between the positive potential terminal $+V_2$ and the negative potential terminal $-V_2$.

Figure 2:
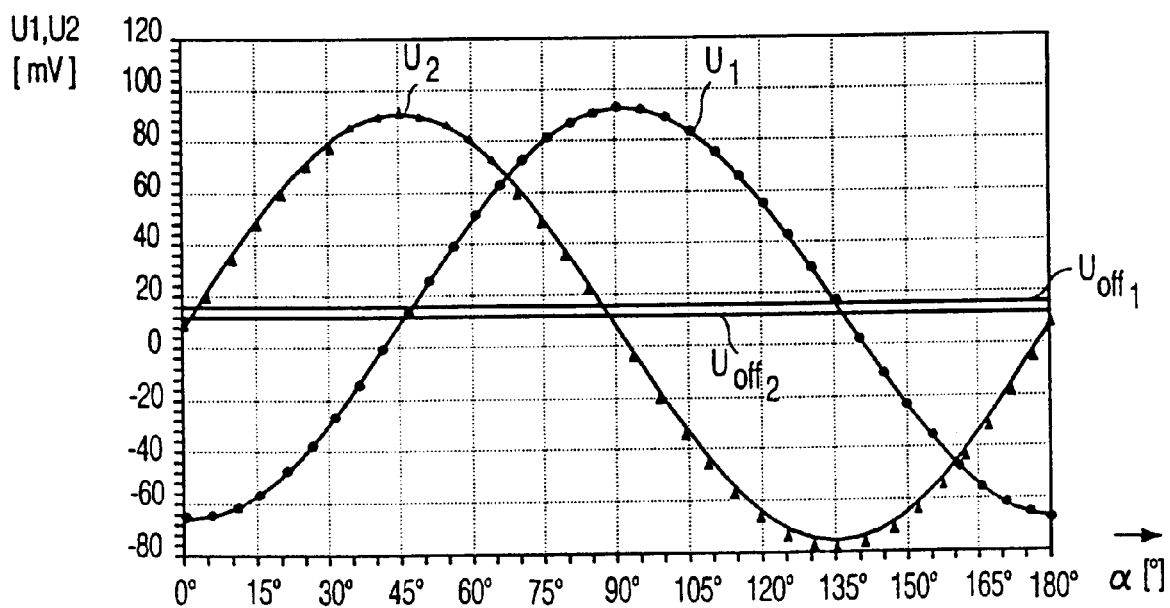

FIG. 2 shows the gradient of the first angle voltage $U_1$ of the first Wheatstone bridge 1 of FIG. 1 and the gradient of the second angle voltage $U_2$ of the second Wheatstone bridge 2 of FIG. 1 in dependence on an angle direction a of a magnetic field which acts upon the angle sensor of FIG. 1. The system of reference co-ordinates is defined here in accordance with FIG. 1. The angle a $\alpha=0°$ extends in longitudinal direction along the third magnetoresistive resistor 5 and the fourth magnetoresistive resistor 6, perpendicular to the longitudinal direction of the first magnetoresistive resistor 3 and the second magnetoresistive resistor 4, enclosing an angle of 45° with each of the magnetoresistive resistors 7, 8, 9 and 10 of the second Wheatstone bridge 2. A negative cosine dependence on the double angle $2\alpha$ of the magnetic field acting on the first Wheatstone bridge 1 is obtained for the first angle voltage $U_1$. A sine dependence on the double angle $2\alpha$ of the magnetic field acting on the second Wheatstone bridge 2 is obtained for the second angle voltage $U_2$. Irreproducibilities in the manufacturing process imply that the resistance values of the individual magnetoresistive resistors of the first Wheatstone bridge 1 and the second Wheatstone bridge 2 will generally be unequal, so that the first angle voltage $U_1$ is shifted by a first offset voltage $U_{off1}$ and the second angle voltage $U_2$ by a second offset voltage $U_{off2}$. The first offset voltage $U_{off1}$ and the second offset voltage $U_{off2}$ cause an error in the angle or direction measurement of the magnetic field acting on the angle sensor and should accordingly be determined and subsequently eliminated by means of a suitable calibration process.

Figure 3:
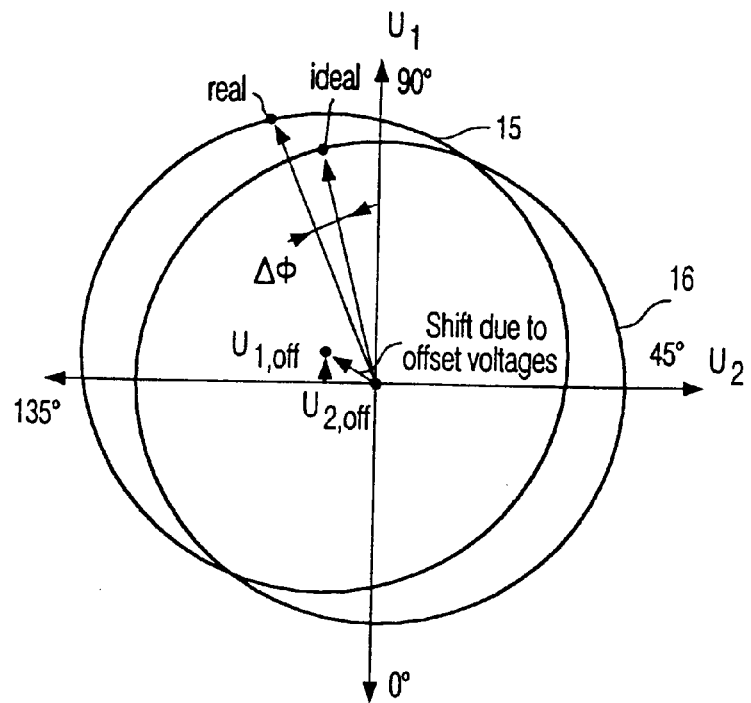
FIG. 3 shows the locus curve of the angle voltages of the magnetoresistive angle sensor of FIG. 1.

FIG. 3 shows the actual locus curve 15 of the first angle voltage $U_1$ and the second angle voltage $U_2$ of FIG. 2. The ideal locus curve 16 for ideal angle voltages $U_1$ and $U_2$ is also shown, i.e. for those not affected by an offset voltage. The ideal locus curve 16 is a circle whose center lies exactly in the point of origin. The non-ideal locus curve 15 of the actual first angle voltage $U_1$ and second angle voltage $U_2$ affected by an offset voltage is also a circle, but its center is shifted relative to the point of origin by the first offset voltage $U_{off1}$ and the second offset voltage $U_{off2}$. A measuring error $\Delta\phi$ results from this in the angle measurement.

Figure 4:
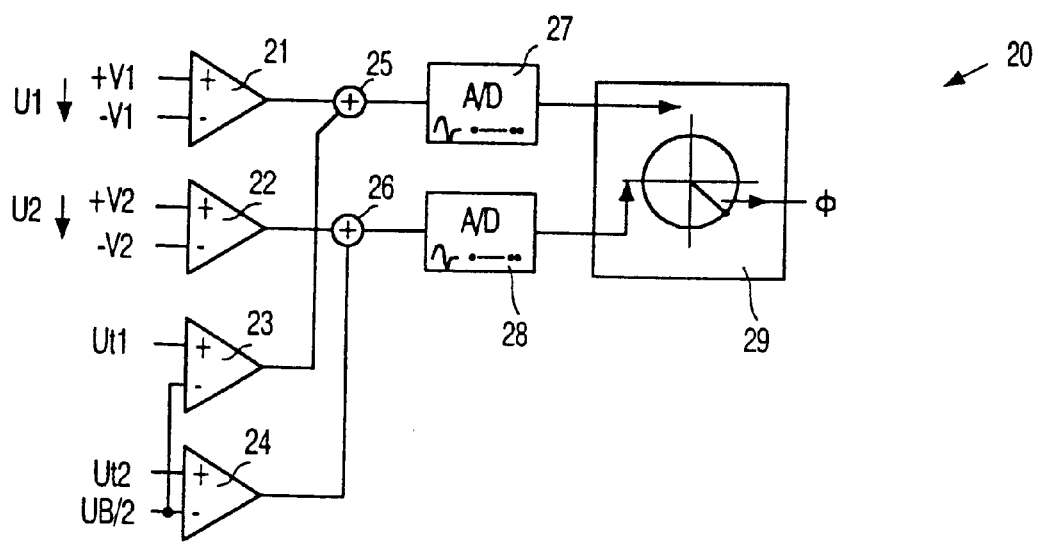
FIG. 4 is a diagram of an evaluation circuit for calculating the angle of the magnetic field acting on the angle sensor in dependence on the angle voltages of the first and the second Wheatstone bridge.

FIG. 4 is a block diagram showing the operating principle of an evaluation circuit 20 which is used for calculating the magnetic field acting on the angle sensor from the first angle voltage $U_1$ of the first Wheatstone bridge 1 and the second angle voltage $U_2$ of the second Wheatstone bridge 2. The evaluation circuit comprises a first differential amplifier 21, a second differential amplifier 22, a third differential amplifier 23, and a fourth differential amplifier 24. The differential amplifiers 21 and 22 have a greater gain factor than the differential amplifiers 23 and 24. The non-inverting input of the first differential amplifier 21 is coupled to the positive potential terminal $+V_1$ of the first Wheatstone bridge 1 of FIG. 1. The inverting input of the first differential amplifier 21 is coupled to the negative potential terminal $-V_1$ of the first Wheatstone bridge 1 of FIG. 1. The non-inverting input of the second differential amplifier 22 is coupled to the positive potential terminal $+V_2$ of the second Wheatstone bridge 2 of FIG. 1. The inverting input of the second differential amplifier 22 is coupled to the negative potential terminal $-V_2$ of the second Wheatstone bridge 2 of FIG. 1. The non-inverting input of the third differential amplifier 23 is supplied with a trimming voltage $U_{t1}$, and a trimming voltage $U_{t2}$ is supplied to the non-inverting input of the fourth differential amplifier 24. Half the potential of the operating voltage $U_{B2}$ is supplied to the inverting inputs of the third differential amplifier 23 and the fourth differential amplifier 24. The outputs of the first differential amplifier 21 and the third differential amplifier 23 are connected to a first adding stage 25. The outputs of the second differential amplifier 22 and the fourth differential amplifier 24 are connected to a second adding stage 26. The output of the first adding stage 25 is coupled to a first A/D converter 27 and the output of the second adding stage 26 is coupled to a second A/D converter 28. The output of the first A/D converter 27 and the output of the second A/D converter 28 are coupled to a digital angle calculation circuit 29. The first angle voltage $U_1$ of the first Wheatstone bridge 1 is thus amplified by the first differential amplifier 21, and the second angle voltage $U_2$ of the second Wheatstone bridge 2 is amplified by the second differential amplifier 22. The offset of the first angle voltage $U_1$ can be eliminated by means of the trimming voltage $U_{t1}$ which is supplied via the third differential amplifier 23 to the first adding stage 25, where it can be added to the first angle signal $U_1$ amplified by the differential amplifier 21. The offset of the second angle voltage $U_2$ of the second Wheatstone bridge 2 can be eliminated by means of the trimming voltage $U_{t2}$, which is supplied via the fourth differential amplifier 24 to the second adding stage 26, where it can be added to the second angle voltage $U_2$ amplified by the second differential amplifier 22. An analog offset compensation thus takes place in the evaluation circuit of FIG. 4. After the first angle voltage $U_1$ and the second angle voltage $U_2$ have been offset-compensated in the first adding stage 25 and the second adding stage 26, respectively, an analog/digital conversion is carried out by the first A/D converter 27 and the second A/D converter 28. The digital angle calculation circuit 29 calculates the angle $\phi$ of the magnetic field acting on the first Wheatstone bridge 1 and the second Wheatstone bridge 2 from the output signals of the first A/D converter 27 and the second A/D converter 28. The Cordic algorithm is preferably used for this purpose.

Figure 5:
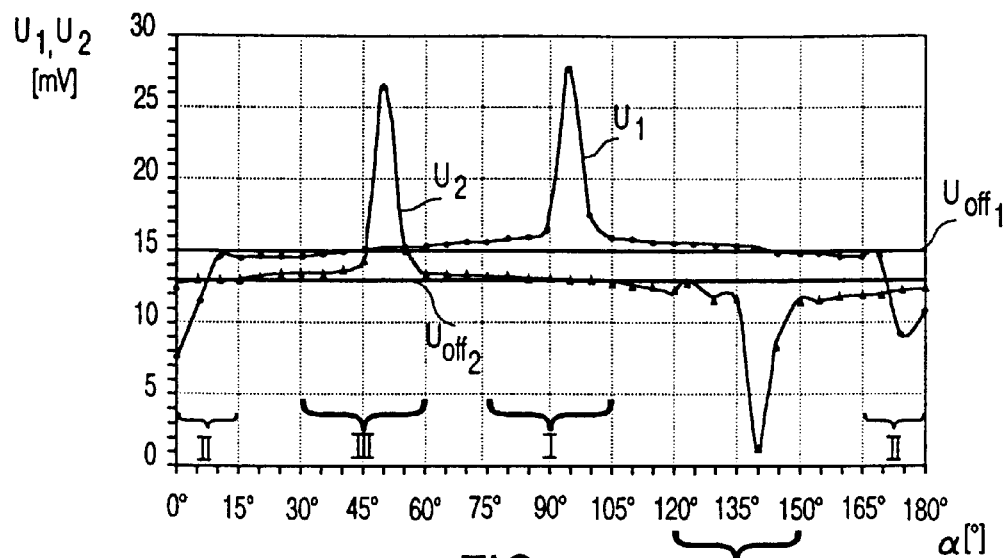
FIG. 5 shows the gradients of the angle voltages of the first and the second Wheatstone bridge of an angle sensor of FIG. I in dependence on the angular direction of a magnetic field by means of which the angle sensor was acted upon in a first step and which was removed in a subsequent second step.

FIG. 5 shows the first angle voltage $U_1$ of the first Wheatstone bridge 1 and the output voltage $U_2$ of the second Wheatstone bridge 2 as a function of the angular direction $\alpha$ of a magnetic field acting on the first Wheatstone bridge 1 and the second Wheatstone bridge 2 in a first step and removed in a second step. At the same time, FIG. 5 shows the first offset voltage $U_{off1}$ of the first Wheatstone bridge 1 and the second offset voltage $U_{off2}$ of the second Wheatstone bridge 2. It is apparent from FIG. 5 that the first angle voltage $U_1$ deviates only very little from the offset voltage $U_{off2}$ after removal of the magnetic field acting on the first Wheatstone bridge 1 in a range from 15 to 75° and in a range from 105 to 165°. The best correspondence between the offset voltage $U_{off1}$ and the angle voltage $U_1$ without an external magnetic field is obtained at an angle $\alpha$ of 45°. The angle voltage $U_2$ of the second Wheatstone bridge 2 corresponds closely to the offset voltage $U_{off2}$ in an angle range from 60 to 120°, in an angle range from 0 to 30°, and in an angle range from 165 to 180°. The best correspondence is obtained at an angle of approximately 90°. A very large deviation between the measured angle voltages $U_1$ and $U_2$ on the one hand and the accompanying offset voltages $U_{off1}$ and $U_{off2}$ on the other hand is present only in certain, comparatively small angle ranges. Major deviations are found in an angle range I from 75 to 105° and in an angle range II from 165 to 15° for the first angle voltage $U_1$. For the second angle voltage $U_2$, the major deviations are found in an angle range III from 30 to 60° and in an angle range IV from 120 to 150°.

The relationship apparent from FIG. 5 can be utilized for the calibration of the first Wheatstone bridge 1 and the second Wheatstone bridge 2. To calibrate the first Wheatstone bridge 1, an external direct magnetic field is made to act thereon in a first step by means of a direct magnet which is so aligned that it lies neither in the angle range I nor in the angle range II. Preferably, an angle $\alpha$ of approximately 45° or approximately 135° is set. In the second process step, the direct magnet, and thus the external direct magnetic field, is removed. Now the first angle voltage $U_1$ at the output of the first Wheatstone bridge 1 corresponds closely to the offset voltage $U_{off1}$. In a third step, the evaluation circuit 20 of FIG. 4 can now carry out an offset calibration of the first Wheatstone bridge 1. For the offset calibration of the second Wheatstone bridge 2, a direct magnetic field is made to act thereon in a fourth step, which field is so directed that it lies neither in the angle range III nor in the angle range IV of FIG. 5. Preferably, the external direct magnetic field is so aligned that an angle $\alpha$ of 90° is obtained. In a subsequent fifth process step, the external direct magnetic field is removed. The second angle voltage $U_2$ available at the output of the second Wheatstone bridge 2 now corresponds closely to the offset voltage $U_{off2}$ of the second Wheatstone bridge 2. The evaluation circuit 20 of FIG. 4 can now carry out an offset calibration of the second Wheatstone bridge 2.

Figure 6:
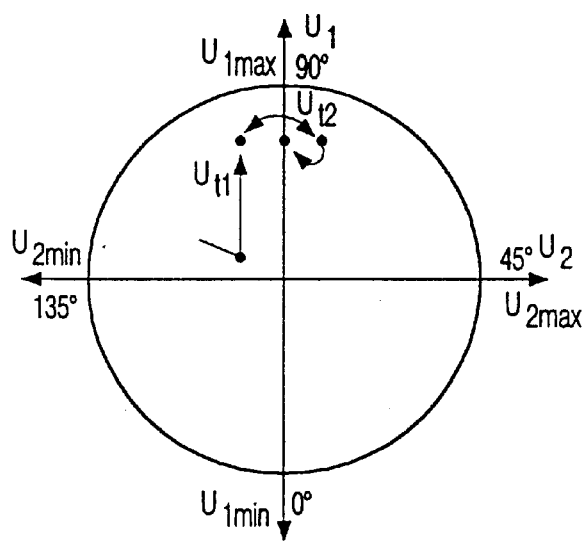
FIG. 6 is a locus curve which illustrates the method for the analog offset compensation of the second Wheatstone bridge, in which the optimum offset compensation voltage for the second Wheatstone bridge is determined through linear interpolation from the measured angles of two trimming voltages.
Figure 7:
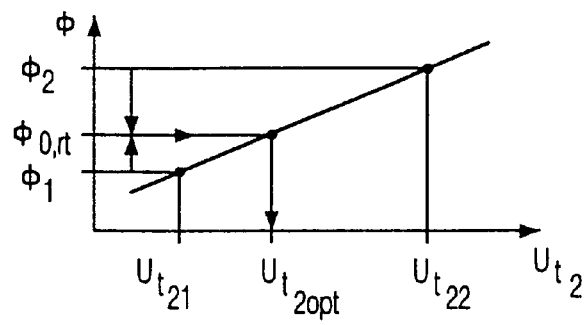
FIG. 7 is a diagram illustrating the trimming process of FIG. 6, in which the measured angle is plotted against the trimming voltage of the second Wheatstone bridge.

An advantageous procedure for determining the trimming voltage $U_{t2}$ of the fourth differential amplifier 24 of the evaluation circuit 20 of FIG. 4 is shown in FIG. 6. After the second Wheatstone bridge 2 has been acted upon by an external direct magnetic field and this external direct magnetic field has been removed, the first angle voltage $U_1$ and the second angle voltage $U_2$ are comparatively small, i.e. the point formed from $U_1$ and $U_2$ is close to the point of origin of the system of co-ordinates in the locus curve represented in FIG. 6 of the first angle voltage $U_1$ and the second angle voltage $U_2$. To avoid non-linear effects, the greatest possible trimming voltage $U_{t1max}$ is added to the first angle voltage $U_1$ by means of the third differential amplifier 23 and the first adding stage 25. Then a first trimming voltage $U_{t21}$ is added to the second angle voltage $U_2$ by means of the second differential amplifier 24 and the second adding stage 26, and the corresponding angle $\phi_1$ is calculated by the digital angle calculation circuit 29. After that, a second, greater trimming voltage $U_{t22}$ is added to the second angle voltage $U_2$, and the angle $\phi_2$ is calculated once more by the digital angle calculation circuit 29. The angles thus calculated by the digital angle calculation circuit 29 for a Wheatstone bridge 2 affected by an offset do not correspond to the ideal angle $\phi_{opt}=90°$ as it should be measured for a Wheatstone bridge 2 without offset. The optimum trimming voltage $U_{t2opt}$ can now be calculated through linear interpolation by the evaluation circuit 20 in which the angle calculated by the digital angle calculation circuit corresponds to the angle $\phi_{opt}=90°$ which is actually to be measured This linear interpolation is shown in FIG. 7.

What is claimed is:

1. A method for the offset calibration of a magnetoresistive angle sensor for the determination of the directions of magnetic fields, which sensor comprises at least a Wheatstone bridge with at least four magnetoresistive resistors, said Wheatstone bridge receives an input signal at its input side and which Wheatstone bridge supplies an angle signal at its output side in dependence on the direction of a magnetic field which acts on the Wheatstone bridge, said Wheatstone bridge comprising a first and a second pair of mutually opposed, substantially parallel magnetoresistive resistors, the first and the second pair being arranged substantially at right angles to one another, while the direction of the magnetic field is determined from the angle signal supplied by the Wheatstone bridge by means of an evaluation circuit, characterized in that in a first step the Wheatstone bridge is acted upon by a direct magnetic field which is so aligned that it is neither substantially perpendicular to the magnetoresistive resistors of the first pair nor substantially perpendicular to the magnetoresistive resistors of the second pair of the Wheatstone bridge, in that in a second step the direct magnetic field is removed, and in that in a third step an evaluation circuit determines an offset calibration signal, the angle signal supplied by the Wheatstone bridge without direct magnetic field being a measure for the offset of the Wheatstone bridge.

2. A method as claimed in claim 1, characterized in that in the first step the Wheatstone bridge is acted upon by a direct magnetic field which encloses an angle of approximately 45° with the magnetoresistive resistors of the first pair an with the magnetoresistive resistors of the second pair of the Wheatstone bridge.

3. A method as claimed in claim 1, characterized in that the angle sensor comprises a second Wheatstone bridge which are arranged at an angle of approximately 45° to the first Wheatstone bridge, in that in the first step the first Wheatstone bridge is acted upon by a direct magnetic field which is so directed that it is neither substantially parallel to the magnetoresistive resistors of the first pair of the first Wheatstone bridge nor substantially parallel to the magnetoresistive resistors of the second pair of the first Wheatstone bridge, in that in the second step the direct magnetic field is removed, and in that in the third step the evaluation circuit is provided for determining an offset calibration signal for the first Wheatstone bridge without the direct magnetic field, while the angle signal supplied without direct magnetic field by the first Wheatstone bridge is a measure for the offset of the first Wheatstone bridge, in that in a fourth step the second Wheatstone bridge is acted upon by a direct magnetic field which is so directed that it is neither substantially parallel to the magnetoresistive resistors of the first pair of the second Wheatstone bridge nor substantially parallel to the magnetoresistive resistors of the second pair of the second Wheatstone bridge, in that in a fifth step the direct magnetic field is removed, and in that in a sixth step the evaluation circuit is provided for determining an offset calibration signal for the second Wheatstone bridge without the direct magnetic field, while the angle signal delivered without direct magnetic field by the second Wheatstone bridge is a measure for the offset of the second Wheatstone bridge.

4. A method as claimed in claim 1, characterized in that the offset calibration includes the addition of an offset compensation voltage to the angle voltage delivered by the Wheatstone bridge for analog signal.

5. A method as claimed in claim 1, characterized in that the evaluation circuit performs the offset compensation for digital signal.

6. A method as claimed in claim 4, characterized in that the evaluation circuit: adds an offset compensation voltage to the respective angle voltages delivered by the first and the second Wheatstone bridge, determines the optimum offset compensation voltage of the first Wheatstone bridge, adds at least a first and a second trimming voltage to the angle voltage of the first Wheatstone bridge through variation of the resistance values, determines the corresponding angle, and calculates the optimum offset compensation voltage for the first Wheatstone bridge by means of an interpolation, the evaluation circuit further adds a programmable DC voltage to the angle voltage of the first Wheatstone bridge for determining the optimum offset compensation voltage of the second Wheatstone bridge, adds at least a first and a second trimming voltage to the angle voltage of the second Wheatstone bridge, and the corresponding angle is determined by means of the evaluation circuit,.

7. A sensor device for measuring the angle of a magnetic field, comprising a magnetoresistive angle sensor which comprises at least a Wheatstone bridge with at least four magnetoresistive resistors, said Wheatstone bridge receives an input signal at its input side, and which Wheatstone bridge supplies an angle signal at its output side in dependence on the direction of a magnetic field which acts on the Wheatstone bridge, said Wheatstone bridge comprising a first and a second pair of mutually opposed, substantially parallel magnetoresistive resistors, the first and the second pair being arranged substantially at right angles to one another, while the direction of the magnetic field is determined from the angle signal supplied by the Wheatstone bridge from an evaluation circuit, characterized in that the evaluation circuit has a calibration mode for determining an offset calibration signal, in that before the start of the calibration mode an external direct magnetic field which is so directed that it is neither substantially parallel to the magnetoresistive resistors of the first pair nor substantially parallel to the magnetoresistive resistors of the second pair of the Wheatstone bridge acts upon the Wheatstone bridge, whereupon said external direct magnetic field is removed, and in that the angle signal supplied by the Wheatstone bridge to the evaluation circuit without direct magnetic field is a measure for the offset of the Wheatstone bridge.

8. A sensor device as claimed in claim 7, characterized in that the evaluation circuit comprises an A/D converter which is provided for measuring the angle signal supplied by the Wheatstone bridge in its calibration mode without direct magnetic field, and in that the evaluation circuit has a non-volatile memory for the digital storage of the angle signal converted by the A/D converter.

9. A sensor device as claimed in claim 7, characterized in that the evaluation circuit adds the offset compensation of the Wheatstone bridge to the angle voltage supplied by the Wheatstone bridge.

* * * * *